United States Patent [19]

Shur et al.

[11] Patent Number: 4,899,200
[45] Date of Patent: Feb. 6, 1990

[54] NOVEL HIGH-SPEED INTEGRATED HETEROSTRUCTURE TRANSISTORS, PHOTODETECTORS, AND OPTOELECTRONIC CIRCUITS

[75] Inventors: Michael Shur, Golden Valley, Minn.; John G. Simmons, Amherst, Mass.

[73] Assignee: Regents of the University of Minnesota, Minneapolis, Minn.

[21] Appl. No.: 202,178

[22] Filed: Jun. 3, 1988

[51] Int. Cl.$^4$ .............................................. H01L 27/14
[52] U.S. Cl. ....................................... 357/30; 357/16; 357/58
[58] Field of Search .................. 357/30 E, 30 I, 30 Q, 357/30 PE, 16, 58

[56] References Cited

U.S. PATENT DOCUMENTS

| | | | |
|---|---|---|---|
| 4,755,857 | 7/1988 | Abstreiter | 357/16 |
| 4,799,088 | 1/1989 | Hijamizu | 357/16 |
| 4,806,998 | 2/1989 | Ninter | 357/16 |

OTHER PUBLICATIONS

"A Self-Aligned Gate Process For IC's Based On Modulation-Doped (Al, Ga)As/GaAs FET's", IEEE Transactions On Electron Devices, vol. Ed-31, No. 12, De. 1984, p. 1963.
S. Luryi, "An Induced Hot-Electron Transistor", IEEE Electron Device Letters, vol. EDL-6, No. 4, Apr. 1985, pp. 178–180.
S. Luryi, T. P. Pearsall, H. Temkin, J. C. Bean, "Waveguide Infrared Photodetectors on a Silicon Chip", IEEE Electron Device Letters, vol. EDL-7, No. 2, 1986, pp. 104–106.
N. C. Cirillo, Jr., M. S. Shur, P. J. Vold, J. K. Abrokwah, R. R. Daniels O. N. Tufte, "Realization of n--Channel and p-Channel High-Mobility (Al, Ga)As/-GaSa Heterostructure Insulating Gate FET's on a Planar Wafer Surface", IEEE Electron Device Letters, EDL-6, No. 12 pp. 645–647 (1985).
Toshiyuki Usagawa et al., "A New Two-Dimensional Electron Gas Base Transistor (2DEG-HBT)", IEMD Technical Digest, 1987, pp. 78–81.
Tzu-Yin Chiu et al., "A High Speed Super Self-Aligned Bipolar-CMOS Technology", IEDM Technical Digest, 1987, pp. 24–27.
Geoffrey W. Taylor, John G. Simmons, "The Bipolar Inversion Channel Field-Effect Transistor (BICFET)—A New Field-Effect Solid-State Device: Theory and Structures", IEEE Transactions on Electron Devices vol. Ed-12, No. 11, Nov. 1985, pp. 2345–2367.
G. W. Taylor and J. G. Simmons, "High-Speed Integrated Heterojunction Field-Effect Transistor Photodetector: A Gated Photodetector," Appl. Phys. Lett., 50 (24) 15 Jun. 1987, pp. 1754–1756.
N. J. Shah, S. S. Pei, C. W. Tu and R. C. Tiberio, Gate--Length Dependence of the Speed of SSI Circuits Using Submicrometer Selectively Doped Heterostructure Transistor Technology, IEEE Trans. Electron Devices, Ed-33, No. 5, May 1986, pp. 543–547.

Primary Examiner—Martin H. Edlow
Attorney, Agent, or Firm—Kinney & Lange

[57] ABSTRACT

A high-speed heterostructure planar integrated circuit includes a planar photodetector together with a transistor (either a Modulation-Doped Field Effect Transistor or a lateral p-n-p bipolar transistor). The planar photodetector includes a bottom confinement layer of a wide bandgap material, a heavily doped first conductivity-type buried layer over the bottom confinement layer, a relatively undoped higher index of refraction layer overlying the buried layer, a top confinement layer of wider bandgap material which has a lower index of refraction, a first vertical contact region of first conductivity type which extends downward to make electrical contact with the buried layer, and a second contact region of second conductivity type spaced laterally from the first contact region and extending through the top confinement layer and a portion of the undoped layer. As a result of the difference in refractive indices of undoped versus doped regions and in wide gap versus narrow gap material, light directed into one end of the photodetector is confined both laterally and vertically to the undoped layer where it is absorbed. Charge separation occurs with first conductivity carries being collected at the first contact region and the buried layer, and second conductivity carriers being collected at the second contact region.

15 Claims, 4 Drawing Sheets

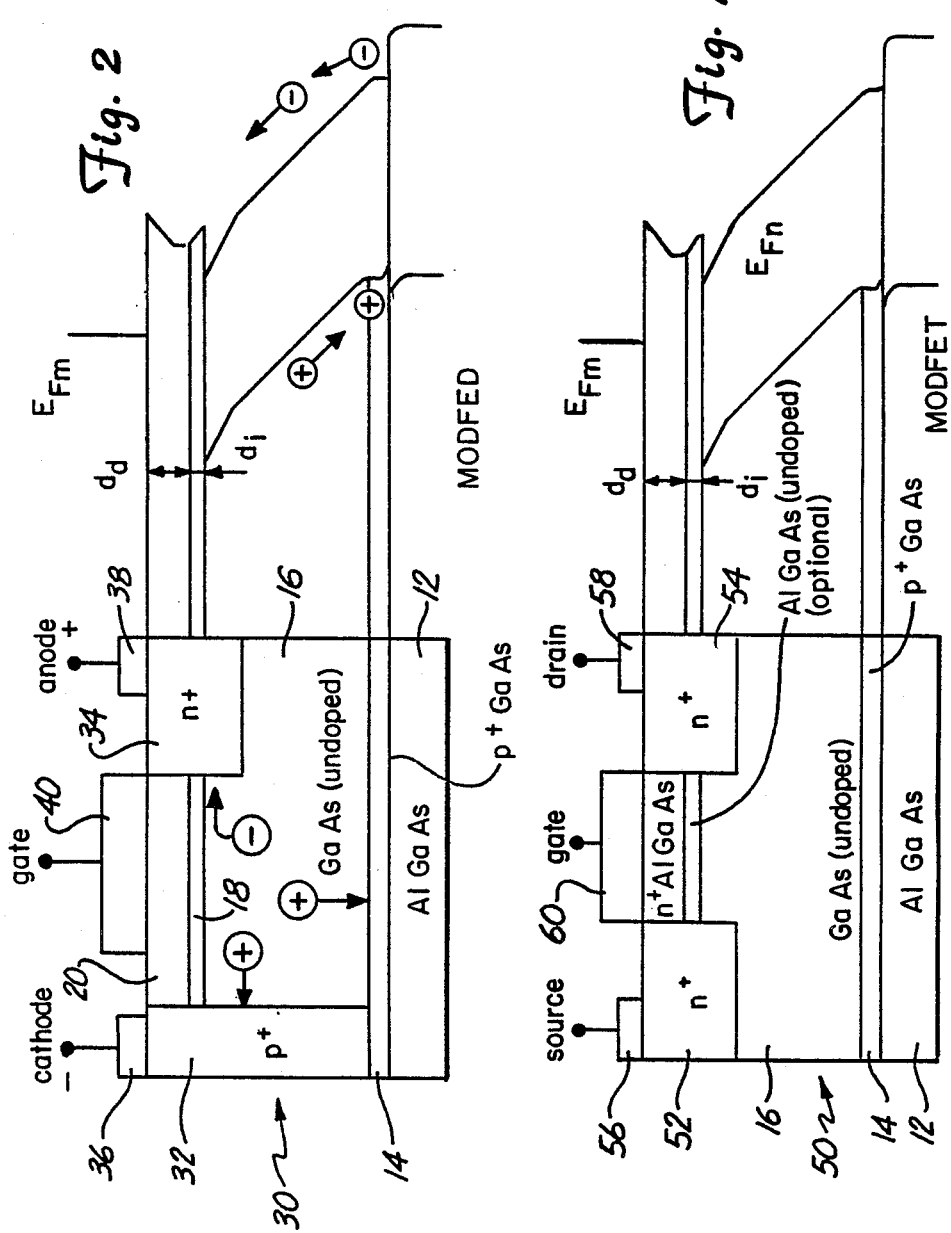

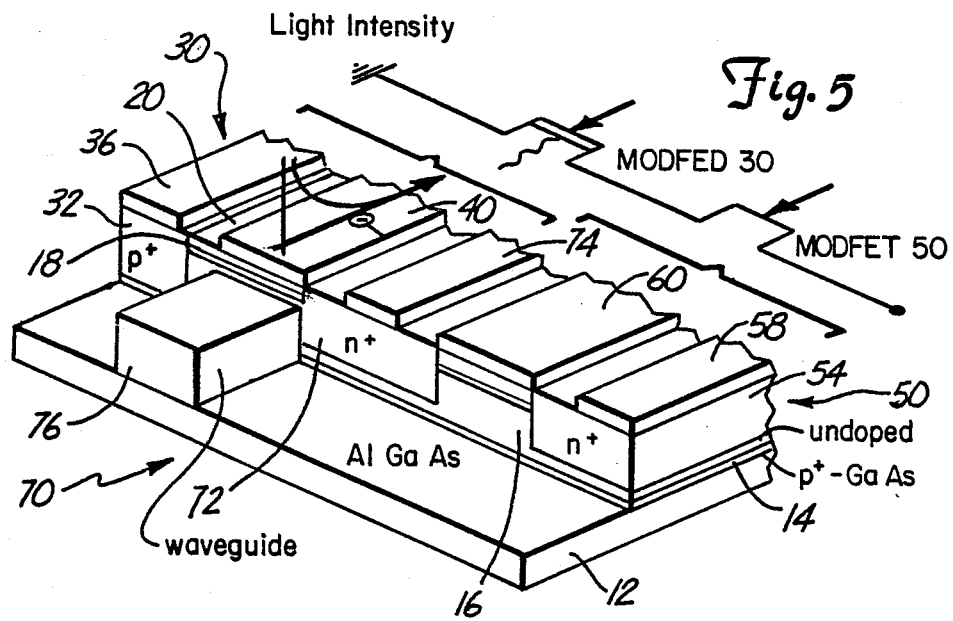
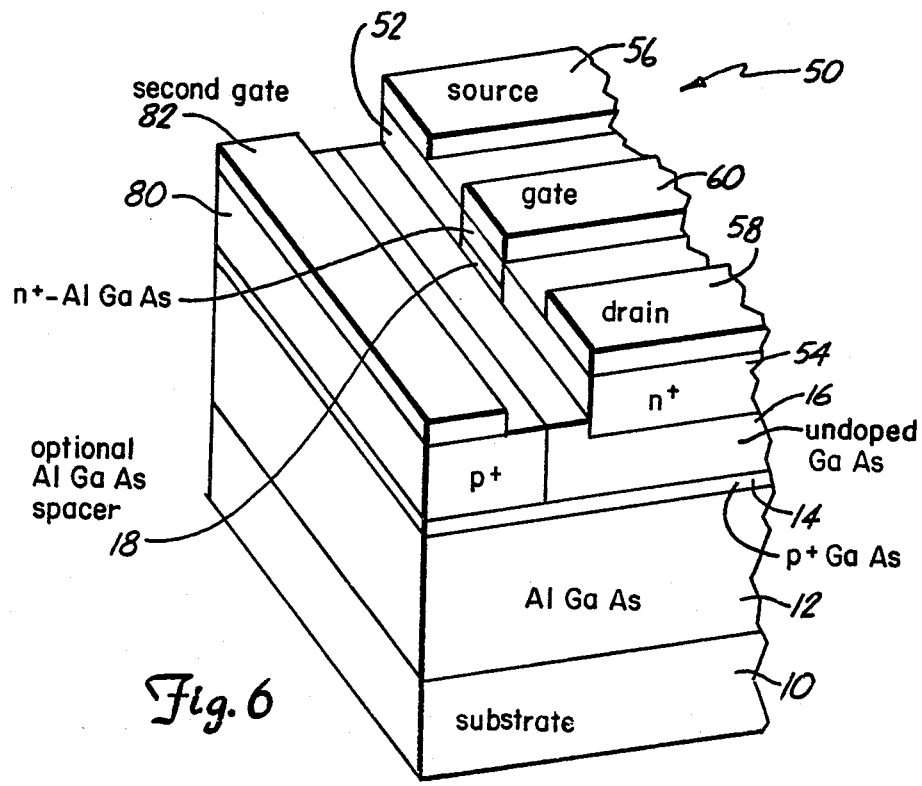

NOVEL HIGH-SPEED INTEGRATED HETEROSTRUCTURE TRANSISTORS, PHOTODETECTORS, AND OPTOELECTRONIC CIRCUITS

BACKGROUND OF THE INVENTION

1. Field of the Invention.

The present invention relates to heterostructure semiconductor devices. In particular, the present invention relates to heterostructure planar photodetectors and to high-speed heterostructure integrated circuits which incorporate a planar photodetector.

2. Description of the Prior Art.

The merging of unipolar and bipolar devices has a great potential for increasing speed of integrated circuits. This approach has been proven very fruitful in silicon electronics (represented primarily by BICMOC technology). See for example, T. Y. Chiu, G. M. Chin, M. Y. Lau, R. C. Hanson, M. D. Morris, K. F. Lee, A. M. Voshchenkov, R. G. Schwarts, V. D. Archer and S. F. Finegan, "A High-Speed Super Self-Aligned Bipolar Technology", *IEDM Technical Digest*, pp. 24–27 (1987). It is even more appealing for compound semiconductor technology where the combination of low power complementary logic and excellent driving capabilities of Heterojunction Bipolar Transistors can allow to increase both speed and integration scale. See for example, N. C. Cirillo, Jr., M. Shur, P. J. Vold, J. K. Abrokwah, R. R. Daniels, and O. N. Tufte, "Realization of n-channel and p-channel High Mobility (Al,Ga)As-GaAs Heterostructure Insulated Gate FETs on a Planar Wafer Surface,"*IEEE Electron Device Letters*, EDL-6, pp 645–647 (1985). Another important advantage is a possibility to use bipolar devices as sensors and light sources, integrated with field effect transistor and bipolar transistor electronics. Recently the first monolithic integration of a Modulation-Doped Field Effect Transistor (MODFET) and Heterojunction Bipolar Transistor was described by T. Usagawa, S. Goto, T. Mishima, M. Yamne, M. Kobayshi, K. Kawata, and S. Takanashi in *IEDM Technical Digest*, pp. 78–81 (1987). The principle of a Heterojunction Bipolar Transistor used in that integrated device is similar to that of a Bipolar Inversion Channel Field-Effect Transistor (BICFET). See G. W. Taylor and J. G. Simmons, "A Bipolar Inversion Channel Field-Effect Transistor (BICFET)—A New Field-Effect Solid State Device: Theory and Structures,"*IEEE Trans. Electron Devices*, ED-32, p2345 (1985).

Difficulty is encountered in integrating planar integrated circuits with conventional optical detectors that require a wide depletion region (typically several tens of microns) in order to absorb all the incident light. Typical detectors are volume, rather than planar devices. Recently a planar-type Heterojunction Field Effect Transistor Photodetector (HFETPD) has been proposed which eliminates the requirement of a wide depletion region. See G. W. Taylor and J. G. Simmons, "High Speed Integrated Heterojunction Field Effect Transistor Photodetector: A Gated Photodetector," *Appl. Phys. Lett.*, 50, No. 24, pp 1754–1756.

The new approach utilized in HFETPD, (and before that, in superlattice detectors proposed by S. Luryi, T. P. Pearsall, H. Temkin, and J. C. Bean, "Waveguide Infrared Photodetectors on a Silicon Chip,"*IEEE Electron Device Letters*, EDL-8, No. 2, pp 104–106 (1986)) is to have the incident light propagation perpendicular to the carrier flow so that the device has both high speed determined by the transit time in a narrow surface region, and efficient light absorption determined by the gate width.

MODFET integrated circuits have become the fastest solid state technology. See for example, N. J. Shah, S. S. Pei, C. W. Tu, and R. C. Tiberio, "Gate-Length Dependence of the Speed of SSI Circuits Using Submicron Selectively Doped Heterostructure Transistor Technology,"*IEEE Trans. Electron Devices*, ED-31, p 543 (1986) and N. C. Cirillo, Jr., J. K. Abrokwah, and M. Shur, "A Self-Aligned Process for IC's Based on Modulation-Doped (Al,Ga)As/GaAs FET's," *EEE Trans. Electron Devices*, ED-31, p. 1963 (1984). Creating MODFET-based integrated optoelectronic circuits is of the utmost importance.

SUMMARY OF THE INVENTION

The present invention is a high-speed integrated heterostructure optoelectronic circuit featuring a planar photodetector which is compatible with heterojunction transistors such as MODFET and bipolar junction transistors.

The planar photodetector is formed in a multilayer heterostructure which includes a bottom confinement layer of wide bandgap material, a heavily doped first conductivity type layer of narrower bandgap material overlying the confinement layer, a relatively undoped layer of the narrower bandgap material overlying the heavily doped layer, and a top region of wider bandgap material. A heavily doped first conductivity type region extends vertically through the top region and the undoped layer to make electrical contact with the heavily doped first conductivity type buried layer, while a heavily doped second conductivity type region which is spaced laterally from the first conductivity type region extends downward through the top region and into a portion of the undoped layer. Because of the difference in index of refraction of the undoped material with respect to the heavily doped layers and regions, light which is incident on the planar photodetector is focused in the undoped layer, where it is absorbed. The first conductivity type region and the buried layer collect first conductivity type barriers while the region of second conductivity type collects second conductivity type carriers.

In a preferred embodiment of the present invention, the top region includes a spacer layer of wide bandgap material immediately overlying the undoped (or lightly doped) layer and a heavily doped second conductivity type layer of the wide bandgap material overlying the spacer layer. A gate terminal is connected to the second conductivity type layer. Terminals are also connected to the first and second conductivity type regions. This creates a three-terminal photodetector device capable of operating in either a p-i-n mode or in an avalanche p-i-n mode by providing a bias voltage between the first and second conductivity regions. The gate terminal allows modulation of the photodetector output.

In preferred embodiments of the present invention, a MODFET is incorporated into the same integrated circuit with the planar photodetector. The MODFET device includes a pair of second conductivity type regions which extend through the top region into the undoped layer and which form the source and drain of the MODFET. A first terminal gate overlies the heavily doped second conductivity type layer. By providing electrical connection to the buried layer of first conductivity type, the MODFET is provided with a second buried gate that can be used for threshold voltage control as well as logic functions.

The heterostructure integrated circuit of the present invention also accomodates lateral bipolar junction transistors in the same heterostructure. A lateral bipolar junction transistor is incorporated by providing second conductivity type regions which form the emitter and collector and which extend downward through the undoped layer to contact the first conductivity type buried layer (which acts as the base of the lateral bipolar junction transistor).

BRIEF DESCRIPTION OF THE DRAWING

FIG. 2 is a schematic cross section and band diagram of a planar photodetector of the present invention.

FIG. 4 is a schematic cross-section and band diagram of an improved MODFET of the present invention.

FIG. 5 is a perspective, partially schematic view of an integrated optical circuit which includes a planar photodetector, MODFET and optical waveguide.

FIG. 6 shows another embodiment of the MODFET of the present invention with a second buried p-type gate.

DETAILED DESCRIPTION OF THE PREFERRED EMBODIMENTS

Figure 1:
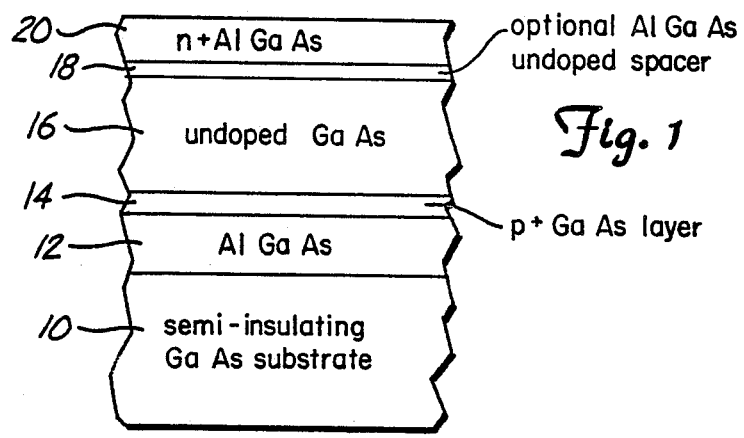
FIG. 1 shows the multilayer heterostructure used in preferred embodiments of the integrated heterojunction devices of the present invention.

The basic multilayer structure for the integrated heterojunction optoelectronic device of the present invention is illustrated in FIG. 1. For purposes of illustration, the heterojunction structure shown in FIG. 1 makes use of a wider bandgap material (AlGaAs) and a narrower bandgap of material (GaAs). Other heterojunction structures using other semiconductor materials are, of course, within the scope of the present invention.

In FIG. 1, the multilayer structure includes (from bottom up) semi-insulating GaAs substrate 10, AlGaAs bottom confinement layer 12, p+ GaAs buried layer 14, relatively undoped (i.e. either undoped or lightly doped) GaAs layer 16, and a top confinement region formed by undoped AlGaAs spacer layer 18, and n+ AlGaAs layer 20.

FIG. 2 shows an integrated planar photodetector 30, which we call a modulation-doped field effect photodetector (MODFED) formed in the structure of FIG. 1. MODFED 30 shown in FIG. 2 includes first p+ vertical contact region 32 which extends down through layers 20, 18, and 16 and makes electrical contact with buried layer 14. Second n+ contact region 34 is spaced laterally from region 32 and extends down through layers 20 and 18, and into layer 16. The bottom of n+ region 34, however, is separated from p+ buried layer 14 by a portion of undoped layer 16.

MODFED 30 is a three terminal device. Cathode 36 is connected to p+ region 32, anode terminal 38 is connected to n+ region 34, and gate terminal 40 is connected to n+ AlGaAs layer 20.

Also shown in FIG. 2 is an energy band diagram for MODFED 30 in an unbiased state (i.e. no bias potential is applied to anode terminal 38, cathode terminal 36, or gate terminal 40). As illustrated in FIG. 2, holes which are generated by absorption of radiation in undoped layer 16 are collected by vertical p+ contact region 32 and buried p+ layer 14. Electrons are collected at n+ contact region 34.

MODFED 30 is a planar device. Light enters directly into GaAs layer 16 under gate 40 and is absorbed in layer 16 while propagating under gate 40 along the gate width (which is the direction perpendicular to the plane in the section shown in FIG. 2). Since the gate width can be made very large (longer than 100 microns or more) all incident light can be readily absorbed. As the light is absorbed, electron-hole pairs are generated in GaAs undoped region 16 as shown in FIG. 2. AlGaAs bottom confinement layer 12 and the top confinement region formed by layers 18 and 20 shown in FIG. 2 confine both light and photo-generated carriers in vertical directions. This is due to the different (lower) indices of refraction and the wider bandgaps of the top and bottom confinement regions with respect to the GaAs layer 16. The lateral spread of light in MODFET 30 is limited because of the difference in refractive index of undoped GaAs (in region 16) and highly doped GaAs (in layer 14 and regions 32 and 34). For heavy implantation into GaAs resulting in high doping levels (n=$10^{19}$ cm$^{-3}$), the refractive index of doped GaAs is smaller than that of undoped GaAs by approximately 0.09. This is comparable to the difference between the refraction index of undoped GaAs and undoped Al$_{0.3}$Ga$_{0.7}$As (approximately 0.13). MODFED 30, therefore, provides light confinement in both lateral and vertical directions (layers 18 and 20 providing confinement on the top, layer 12 providing confinement on the bottom, and regions 32 and 34 providing confinement on both sides). Depending upon the amount of lateral confinement required, region 34 can be extended more deeply into undoped layer 16, so long as region 34 does not contact p+ layer 14. The portion of undoped layer 16 in which light is confined will be referred to as the "active region" of MODFED 30.

Figure 3:
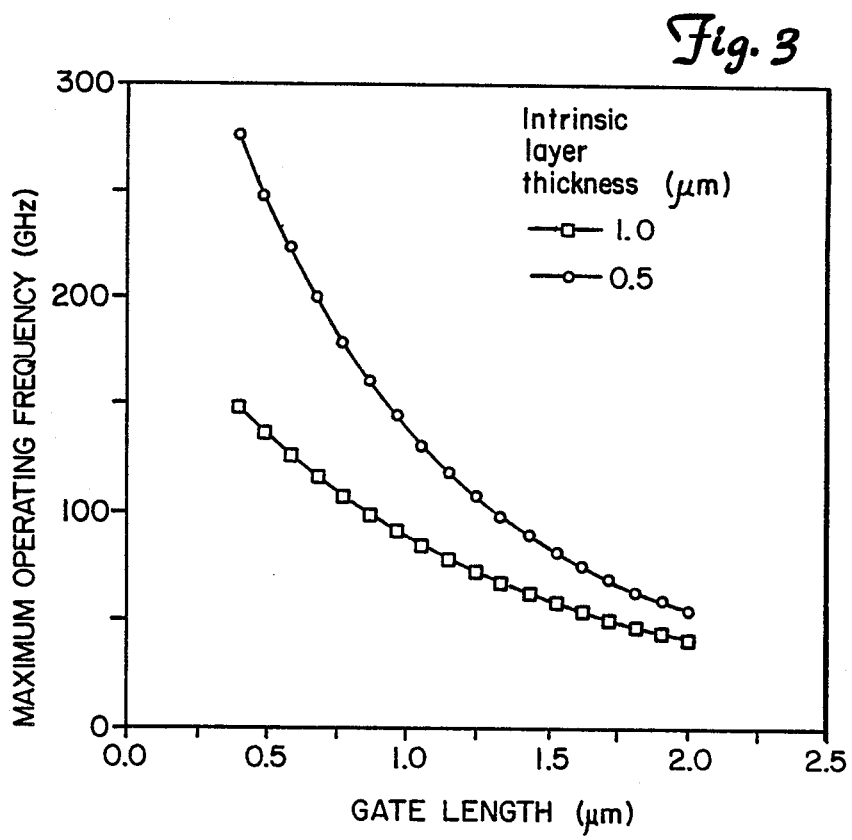
FIG. 3 is a graph of maximum operating frequency as a function of gate length of the planar photodetector.

Holes generated in the active region accelerate toward and are collected by either p+ contact region 32 or p+ buried layer 14. Electrons generated throughout the thickness of p+ buried layer 14 and undoped layer 16 move toward the heterointerface between layer 18 and layer 16 and then along the heterointerface toward n+ region 34, as shown in FIG. 2. Hence, holes travel, on average, only half of the thickness of the active region in undoped GaAs layer 16, and electrons travel, on average, half of the combined thickness of undoped GaAs layer 16 and p+ GaAs layer 14, plus half of the gate length before they are collected. This is advantageous for MODFED 30 performance because electrons (that travel a longer distance than holes) have higher mobility and saturation velocity. Thus, a very high MODFED speed (limited by transit time through the region of the order of a micron or even less) is combined with very effective absorption determined by the gate width. The MODFED frequency response is limited by the longest transit time. A conservative estimate for the maximum operating frequency may be obtained by assuming that:

$$f_{max} = 1(t_n + t_p)$$

where $$t_n = (L+d)/(2v_n)$$

$$t_p = d/(2v_p)$$

are the electron and hole transit times. L is the MODFED gate length, d is the thickness of the intrinsic high field region, $v_n$ is the electron velocity, $v_p$ is the hole velocity. The calculation of $f_{max}$ on L for different values of d using the value of $v_p = 10^5$ m/s and the length-dependent electron saturation velocity (to account for overshoot and ballistic effects) shows that very large operation frequencies (approaching 400 GHz for devices with 0.5 μm feature size) may be reached. FIG. 3 is a graph showing maximum operating frequency as a function of gate length L for two different thicknesses of GaAs undoped layer 16.

An additional advantage of MODFED 30 is the absence (or very low level) of dopants in the active region of GaAs layer 16. This reduces impurity scattering, thereby enhancing the electron mobility and velocity.

Gate terminal 40 of MODFED 30 allows control of the mode of operation and/or modulation of the photogenerated current. By applying appropriate gate and anode voltages, the MODFED 30 may be operated in either the avalanche or p-i-n photodetector mode. Indeed, the avalanche is primarily controlled by the electric field at regions 34 of the device 30 which is of order of $V_{ag}/d_1$ where $V_{ag}$ is the anode-to-gate voltage and $d_1$ is the thickness of the AlGaAs layers 18 and 20. Typically, $d_1$ is of the order of 250 to 500 Å and values of $V_{ag}$ of the order of 10 V or so lead to the avalanche breakdown. Hence, by choosing $V_{ag}$ close to the breakdown condition we can control the avalanche by the gate voltage. (We have seen this effect in all standard MODFET devices.) As is well known, the p-i-n mode provides low noise, the avalanche regime combines the high speed with gain. Also, by incorporating quantum wells into the undoped GaAs region 16 near the heterointerface, the thermal noise may be reduced.

FIG. 4 shows an improved MODFET 50 formed in the same heterostructure as MODFED 30 of FIG. 2. MODFET 50 has an n+ source region 52 and n+ drain region 54 which extend downward through layers 20 and 18 and into undoped layer 16. Source terminal 56 is connected to source region 52, drain terminal 58 is connected to drain region 54, and gate terminal 60 overlies a portion of layers 18 and 20 located between source 52 and drain 54.

Basically, MODFET 50 is similar to other MODFETs proposed in the past except for the inclusion of bottom confinement layer 12 and p+ GaAs buried layer 14. These layers are needed for MODFED 30, but also provide potential benefits in device performance for MODFET 50 as well. In particular, a potential barrier is created for carrier injection into substrate 10 (which is not shown in FIG. 3, but which underlies confinement layer 12). This barrier to carrier injection into substrate 10 reduces the output conductance and increases the device gain in logic and microwave circuits.

FIG. 5 shows an integrated optoelectronic circuit 70 which includes MODFED 30 and MODFET 50. FIG. 5 illustrates the devices both in a perspective and schematic representation. For simplicity, substrate 10 is omitted, but it is understood that substrate 10 underlies bottom confinement layer 12.

Integrated circuit 70 shown in FIG. 5 incorporates into a single device both MODFED 30 and MODFET 50, and reference characters similar to those used in FIGS. 2 and 4 are also used in FIG. 5. Because of the series connection of MODFED 30 and MODFET 50, n+ anode region 34 of MODFED 30 and n+ source region 52 of MODFET 50 are combined into a single n+ region 72. Similarly, anode terminal 38 and source terminal 56 are combined into a single terminal 74.

As shown in FIG. 5, integrated circuit 70 also includes optical waveguide 76 which directs light into the active region of MODFED 30. As described previously, the light from waveguide 76 which is incident upon MODFED 30 is confined to GaAs undoped layer 16 which forms the active region. The gate width of MODFED 30 can be made large, so that very efficient absorption of the light is achieved. FIG. 5 also includes graphically a representation of light intensity as a function of distance in the gate width direction.

FIG. 6 shows another embodiment of MODFET 50 which makes additional advantageous use of p+ buried layer 14 as a second or bottom gate. In the embodiment shown in FIG. 6, a portion of AlGaAs layers 18 and 20 has been selectively removed to expose the top surface of layer 16. Gate contact p+ region 80 extends down through undoped layer 16 to make electrical contact with p+ buried layer 14. Second gate terminal 82 provides an electrical contact to region 80, therefore to buried layer 14.

The use of a second buried gate formed by p+ buried layer 14 permits the threshold voltage of MODFET 50 to be controlled by the voltage $V_p$ applied to the buried layer 14.

As shown in FIG. 6, the buried p-type layer can also be used in order to provide a second gate control of the MODFET 50. Such a device can be used as a field effect transistor with the threshold voltage, $V_p$, applied to the buried p-layer. An estimate for this threshold voltage shift, $\Delta V_t$, obtained using a charge control model leads to $$\Delta V_t = \epsilon_1 d_{eff} V_p / (\epsilon_2 L_p)$$

where $L_p$ is the thickness of the p-layer, $d_{eff} = d + \Delta d$, d is the distance between the gate and electron gas (approximately 80 Å at room temperature). As can be seen from this expression, the control by p+ buried layer 14 easily allows shifting the threshold voltage from negative (normally-on) to positive (normally-on) values and, hence, allows implementation of logic families such as Direct Coupled Field Effect Logic as well as additional logic functions.

Figure 7:
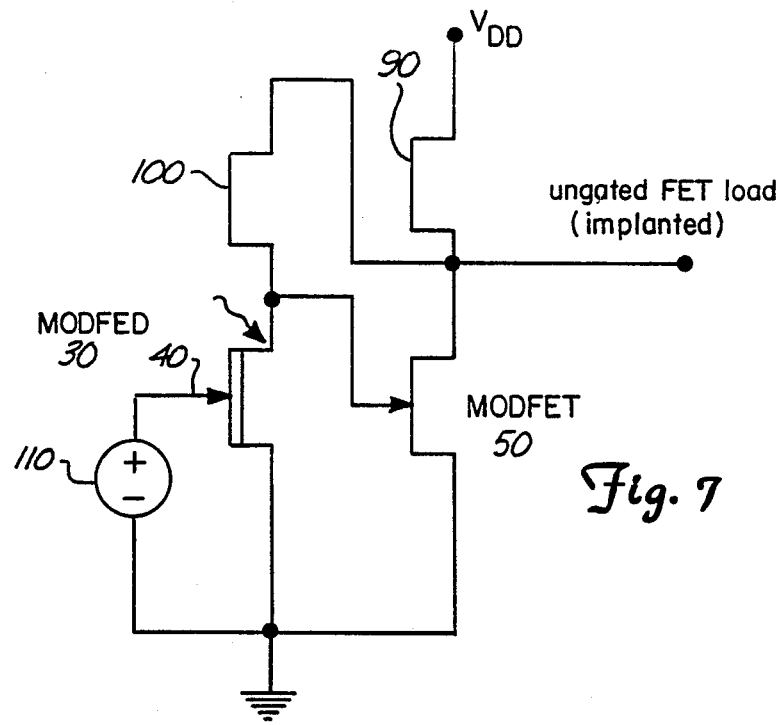
FIG. 7 is an electrical schematic diagram of a circuit combining the planar photodetector and MODFET.

FIG. 7 shows a schematic diagram of a circuit combining MODFED 30 and MODFET 50. In this circuit, an ungated FET load formed by FETs 90 and 100 is provided. Bias source 110 provides a gate-to-anode bias to MODFED 30. The constant bias from source 110 to the gate terminal 40 of MODFED 30 allows a choice of mode of operation. An input AC signal from source 110 to gate terminal 40 of MODFED 30 causes a modulation of the output of MODFED 30. This can be used for simply modulating the output, or for mixing and heterodyning the received photo signal.

Figure 8:
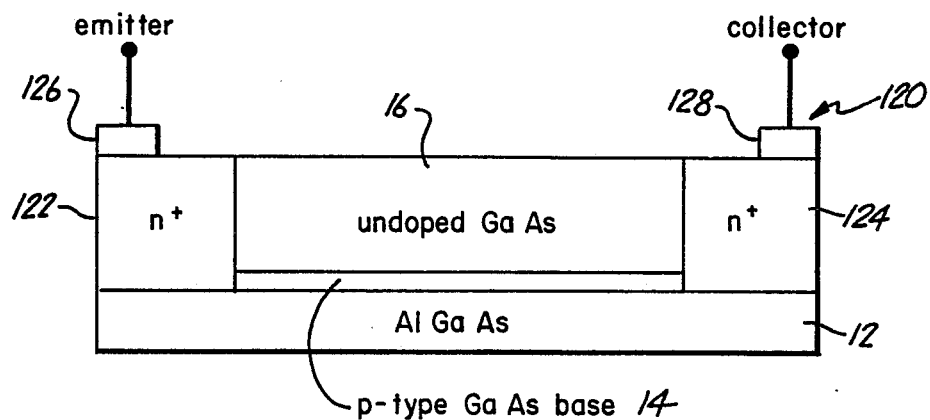
FIG. 8 is a sectional view of a lateral bipolar junction transistor formed in the same heterostructure integrated circuit as the planar photodetector of FIG. 2.

FIG. 8 shows schematically a structure of a lateral bipolar junction transistor 120 which can be readily integrated in the same heterostructure used to form MODFED 30 and MODFET 50. In this case, the top AlGaAs layers 18 and 20 are etched away and buried p+ GaAs layer 14 acts as the base region of transistor 120. The n+ regions 122 and 124 form the emitter and collector of transistor 120. Emitter terminal 126 is connected to emitter region 122, and collector terminal 128 is connected to collector region 124. The base terminal is not shown in FIG. 8, but can be made in a fashion similar to the contact to buried layer 14 shown in FIG. 6.

The speed of bipolar junction transistor 120 is controlled by parasitics, and by the transit time across the lateral base formed by p-type layer 14. The transit time, however, can be made quite short by utilizing short dimensions and self-aligned technology.

Still other structures can be formed which are compatible with the heterostructure shown in FIG. 1 which are compatible with MODFED 30. For example, if two additional layers (a p+ AlGaAs and a p+ GaAs layer) are grown on top of the heterostructure shown in FIG. 1, the structure becomes identical to that proposed for a p-n-p heterojunction bipolar transistor described by T. Usugawa et al, *IDEM Technical Digest*, pp. 78-81 (1987). In this device, the p+ AlGaAs layer serves as an emitter, the bottom p+ layer 14 serves as a collector, and the n-type base is created by the induced two-dimensional electron gas (similar to a unipolar induced base transistor as described by S. Luryi, "An Induced Base Hot-Electron Transistor," *IEEE Electron Device Letters*, EDL-6, pp. 178-180). The combination of this p-n-p device with the lateral n-p-n device of FIG. 8 may be used for complementary bipolar circuits which are compatible with MODFED 30.

In conclusion, the addition of a p+ buried layer 14 and a confinement layer 12 to a heterojunction structure can be used to create a family of optoelectronic integrated circuits, such as modified MODFET, a MODFET with a second buried gate that can be used for both threshold voltage control and new logic functions, a lateral p-n-p bipolar transistor, and a new lateral photo-detector (MODFED).

Although the present invention is been described with reference to preferred embodiments, workers skilled in the art will recognize that changes may be made in form and detail without departing from the spirit and scope of the present invention. For example, although the embodiments shown have included spacer layer 18 between n+ layer 20 and undoped layer 16, spacer layer 18 is optional and is not used in some embodiments of the present invention. Also, instead of an AlGaAs/GaAs system, other heterostructure systems using semiconductor materials of different bandgaps can also be used. For example, if a heterostructure system is used in which $In_{0.53}Ga_{0.47}As$ in place Of GaAs and InP replacing AlGaAs, the absorption coefficient of MODFED 30 will match the requirements for long-wave communication systems where the wavelength is 1.32 to 1.55 microns.

What is claimed is:

1. A planar photodetector comprising:
   a bottom confinement layer of a first wider bandgap material;
   a buried layer of a second narrower bandgap material overlying the bottom confinement layer, the buried layer having a first conductivity type;
   a essentially undoped layer of the second material overlying the buried layer;
   a top confinement layer overlying the undoped layer and having a wider bandgap than the second material;
   a first contact region of first conductivity extending vertically through the top region and the relatively undoped layer to make electrical contact with the buried layer;
   a second contact region of second conductivity type spaced laterally from the first contact region and extending vertically into the undoped layer, the second contact region being spaced from the buried layer;
   first terminal means electrically connected to the first contract region; and
   second terminal means electrically connected to the second contact region.

2. The photodetector of claim 1 and further comprising:
   third terminal means connected to the top confinement layer to form a gate region between the first contact region and the second contact region.

3. The photodetector of claim 2 and further comprising:
   means connected to the third terminal means for applying an electrical signal to the gate region.

4. The photodetector of claim 2 wherein the top confinement layer comprises:
   an undoped spacer layer overlying the undoped layer; and
   a layer of second conductivity type overlying the spacer layer.

5. The photodetector of claim 4 wherein the third terminal means is in electrical contact with the layer of second conductivity type.

6. The photodetector of claim 1 wherein the undoped layer has a higher index of refraction than the bottom confinement layer, the first contact region, the top confinement layer, and the second contact region.

7. A heterojunction optoelectronic device comprising:
   a heterostructure which includes a narrow bandgap layer positioned between top and bottom wider bandgap layers, the narrower bandgap layer including a heavily doped buried layer of first conductivity type adjacent the bottom layer and a relatively undoped layer overlying the buried layer; and
   a photodetector formed in the hetero-structure, the photodetector including first and second vertically extending contact regions of first and second conductivity type, respectively; the first and second contact regions being spaced apart laterally; the first contact region being in electrical contact with the buried layer; the top and bottom layers and the first and second contact regions defining an active region in the relatively undoped layer for guiding and absorbing incident optical radiation.

8. The device of claim 7 and further comprising:
   a transistor formed in the heterostructure.

9. The device of claim 8 wherein the transistor includes:
   a drain region and a source region laterally spaced and extending vertically through the top layer and into the undoped layer; and
   a first gate terminal in contact with the top layer, the gate terminal positioned between the drain and source regions.

10. The device of claim 9 wherein the drain and source regions are of second conductivity type.

11. The device of claim 10 and further comprising:

a second gate contact region of first conductivity type for electrically contacting the buried layer.

12. The device of claim 9 wherein the top layer includes an undoped spacer layer and a heavily doped layer of second conductivity type.

13. The device of claim 8 wherein the transistor includes:
an emitter region and a collector region of second conductivity type laterally spaced and extending through the undoped layer and into contact with the buried layer to form a lateral bipolar transistor in which the buried layer between the emitter region and the collector region is a base region of the transistor.

14. The device of claim 7 and further comprising:
waveguide means for directing the optical radiation into the active region.

15. The device of claim 7 wherein the photodetector further includes:
gate terminal means positioned between the first and second contact regions for applying a modulating signal to modulate an output signal of the photodetector.

* * * * *

UNITED STATES PATENT AND TRADEMARK OFFICE
CERTIFICATE OF CORRECTION

PATENT NO.  : 4,899,200
DATED       : February 6, 1990
INVENTOR(S) : Michael Shur et al.

It is certified that error appears in the above-identified patent and that said Letters Patent is hereby corrected as shown below:

Column 8, line 11, delete "contract" and insert --contact--.

Signed and Sealed this

Twenty-ninth Day of January, 1991

Attest:

HARRY F. MANBECK, JR.

*Attesting Officer*          *Commissioner of Patents and Trademarks*